(12) United States Patent
Hwan

(10) Patent No.: US 7,273,768 B2
(45) Date of Patent: Sep. 25, 2007

(54) WAFER-LEVEL PACKAGE AND IC MODULE ASSEMBLY METHOD FOR THE WAFER-LEVEL PACKAGE

(75) Inventor: Lu-Chen Hwan, Taipei (TW)

(73) Assignee: Mutual-Pak Technology Co. Ltd. (TW)

( * ) Notice: Subject to any disclaimer, the term of this patent is extended or adjusted under 35 U.S.C. 154(b) by 268 days.

(21) Appl. No.: 11/213,847

(22) Filed: Aug. 30, 2005

(65) Prior Publication Data

US 2007/0048901 A1 Mar. 1, 2007

(51) Int. Cl.
*H01L 21/50* (2006.01)
*H01L 21/58* (2006.01)
*H01L 21/60* (2006.01)

(52) U.S. Cl. .................. 438/113; 438/114; 438/108; 438/465

(58) Field of Classification Search ........... 438/108, 438/113, 114, 127, 465, 613
See application file for complete search history.

(56) References Cited

U.S. PATENT DOCUMENTS

| | | | |
|---|---|---|---|
| 5,703,755 A * | 12/1997 | Flesher et al. | 361/737 |
| 5,925,934 A * | 7/1999 | Lim | 257/778 |
| 6,291,270 B1 * | 9/2001 | Saito | 438/114 |
| 6,506,681 B2 * | 1/2003 | Grigg et al. | 438/692 |
| 6,579,748 B1 * | 6/2003 | Okuno et al. | 438/124 |
| 6,649,445 B1 * | 11/2003 | Qi et al. | 438/108 |
| 6,653,731 B2 * | 11/2003 | Kato et al. | 257/737 |
| 6,900,532 B1 * | 5/2005 | Kelkar et al. | 257/698 |
| 6,905,946 B2 * | 6/2005 | Grigg et al. | 438/459 |
| 6,908,784 B1 * | 6/2005 | Farnworth et al. | 438/106 |
| 6,949,834 B2 * | 9/2005 | Connell et al. | 257/777 |
| 6,965,160 B2 * | 11/2005 | Cobbley et al. | 257/686 |
| 6,995,041 B2 * | 2/2006 | Connell et al. | 438/112 |
| 7,002,245 B2 * | 2/2006 | Huang et al. | 257/701 |
| 7,019,406 B2 * | 3/2006 | Huang et al. | 257/778 |
| 2002/0041039 A1 * | 4/2002 | Bai | 257/790 |
| 2004/0121563 A1 * | 6/2004 | Farnworth et al. | 438/465 |
| 2005/0001785 A1 * | 1/2005 | Ferguson et al. | 343/895 |
| 2005/0258537 A1 * | 11/2005 | Huang et al. | 257/738 |
| 2006/0027936 A1 * | 2/2006 | Mizukoshi et al. | 257/781 |
| 2006/0030071 A1 * | 2/2006 | Mizukoshi et al. | 438/106 |
| 2006/0030081 A1 * | 2/2006 | Connell et al. | 438/126 |
| 2006/0134901 A1 * | 6/2006 | Chaware et al. | 438/612 |
| 2007/0020815 A1 * | 1/2007 | Chaware et al. | 438/126 |
| 2007/0152325 A1 * | 7/2007 | Dani et al. | 257/717 |

* cited by examiner

*Primary Examiner*—M. Wilczewski
(74) *Attorney, Agent, or Firm*—Hershkovitz & Associates; Abe Hershkovitz

(57) ABSTRACT

A wafer-level package and an IC module assembly method for a wafer-level package are provided in the present invention. The method comprises forming a metal bump on a wafer, applying a high polymer resin coating to the wafer, grinding a surface of the resin coating, printing an endpoint on the wafer, a grinding and cutting step and bonding the chips to an antenna or substrate with SMT. The present invention can be used to manufacture high quality chips of low cost with mass production to significantly reduce cost and maintain high quality of the products.

6 Claims, 5 Drawing Sheets

WAFER-LEVEL PACKAGE AND IC MODULE ASSEMBLY METHOD FOR THE WAFER-LEVEL PACKAGE

BACKGROUND OF THE INVENTION

1. Field of the Invention

The invention relates to a wafer-level package comprising a printing technique for a small sized IC (integrated circuit) such as a RFID (radio frequency identification) IC, an LED (light emitting diode) IC, a diode IC and the like, which has just a few pins. The wafer-level package is further fabricated into a SMT (surface mounting technology) component after grinding and cutting, and can be then assembled on an antenna or a substrate with SMT.

2. Description of the Related Art

In a conventional chip scale package (CSP), production capability and yield of small sized ICs (integrated circuits) are not high. Each wafer is used to manufacture many chips. The chips are then used to fabricate small sized ICs (integrated circuits) such as an RFID (radio frequency identification) IC, an LED (light emitting diode) IC, a diode IC and the like with a few pins. Since the chips are packaged individually, packaging the chips on a wafer with, for example, 30K chips requires a lot of time. On the other hand, a wafer-level package fabricates the ICs on a wafer as a compete IC rather than individual chips, and cuts the wafers into complete packaged ICs. The production efficiency of the wafer-level package for small IC chips is very high. Because a production unit is based on wafers, the general wafer-level package uses equipment similar to equipment used in semiconductor manufacturing, for example, the semiconductor manufacturing processes of metal sputtering, photo etching, polymer coating, solder ball application and the like. Since the wafer-level package is accomplished on wafers, the manufacturing cost for the wafer-level ICs is very high because the investment cost for the manufacturing equipment is very expensive.

For typical small-sized ICs such as RFID or LED ICs, packaging and assembly efficiency is a crucial factor in the determination of product cost. With reference to FIGS. 1A-1E and 2A-2F, conventional single chip packaging and assembly methods comprise scoring and cutting individual ICs from a wafer, bonding the ICs to a substrate, attaching bonding wires and covering or encapsulating the assembly to form an IC module. The IC module is then connected to an antenna or mounted on a substrate to make a product. Mass production equipment for single chip packaging and assembly is very expensive, and the production capability is rather low, so that product unit price is very high. Furthermore, the single chip package is too thick to make very thin small products.

A number of sequential processes are involved in fabricating and packaging single chip products. First, process of FIG. 1A prepares a wafer (70) with multiple wire pads (72). Process of FIG. 1B is wafer cutting and grinding to form chip (71), wherein each chip (71) has several wire pads (72). Process of FIG. 1C is die bonding and wire bonding, wherein the chip (71) is mounted on a substrate (73) and is connected to wire pads (731) on the substrate (73) via wires (74). Process of FIG. 1D is encapsulating, wherein the chip (71) is encapsulated by packaging material (75). The last process of FIG. 1E is packaging, wherein films (77) are applied to package the encapsulated chip (71).

A flip chip packaging method is used to fabricate thin small products, such as IC cards and RFIDs. A metal bump is formed on the wafer. Then the flip chip method is used to attach the IC to a module or directly connect the IC to an antenna or mount the IC on a substrate after wafer grinding and cutting to form a semi-finished wafer-level package.

A number of sequential processes are involved in fabricating thin small products. First, process of FIG. 2A prepares a wafer (80) with multiple wire pads (81). Process of FIG. 2B is bump forming, wherein multiple metal bumps (82) such as gold bumps are formed on the wire pads (81). Process of FIG. 2C is wafer grinding and cutting to form multiple chips (83). Process of FIG. 2D prepares a substrate (90) on which conductive circuits (92) and a layer of conductive paste (91) such as silver paste are applied. The last two processes of FIGS. 2E and 2F are flip chip assembly, wherein the chip (83) is mounted on the substrate (90) and further encapsulated and packaged by films (100)(101).

However, this fabrication method only can be used for flip chip assembly products and cannot be used for SMD products. Problems with flip chip processes are also low production efficiency and high equipment cost that cause a high product unit price, so this method is not used by many manufacturers.

SUMMARY OF THE INVENTION

An objective of the present invention is to provide a wafer-level package and an IC module assembly method for the wafer-level package.

According to the objective of the present invention, the wafer-level package makes use of features of the IC module of a small sized IC with few pins to apply an inexpensive wafer-level package method, and then to grind and cut a wafer into a SMD (surface mount device) product. The SMD product can be effectively manufactured and connected to an antenna or mounted on a substrate with mass production.

With the wafer-level package and the IC module assembly method for the wafer-level package in accordance with the present invention, designed products can be accomplished by simple techniques at low cost.

The method comprises:
1. forming a metal bump on a wafer;
2. applying a high polymer resin coating;
3. grinding a surface of the resin;
4. printing endpoint;
5. grinding and cutting; and
6. bonding the chips to an antenna or a substrate with SMT (surface mounting technology).

DETAILED DESCRIPTION OF THE INVENTION

The invention fabricates and assembles a wafer-level package with a method using a printing technique to fabricate a small sized IC (integrated circuit) such as a RFID (radio frequency identification) IC, an LED (light emitting diode) IC, a diode IC and the like with few pins. A wafer is fabricated into an SMT (surface mounting technology) component product by grinding and cutting, and then assembly onto an antenna or a substrate with SMT.

With reference to FIGS. 3A-3I, the method in accordance with the present invention comprises forming metal bumps (11) on a wafer (10), applying a high polymer resin coating (20) to the wafer (10), grinding a surface of the resin coating (20), printing an endpoint on the wafer (10), a grinding and cutting step (50) and bonding the chips to an antenna or substrate with SMT.

Figure 1A:
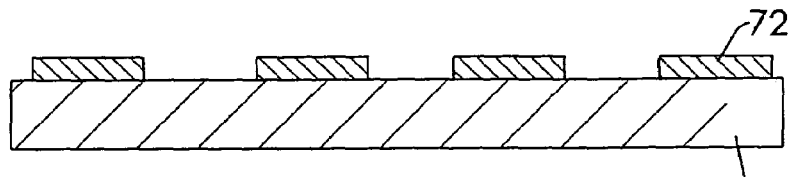
FIGS. 1A-1E show a sequential partial product diagrams of a conventional wafer-level package method.
Figure 1B:
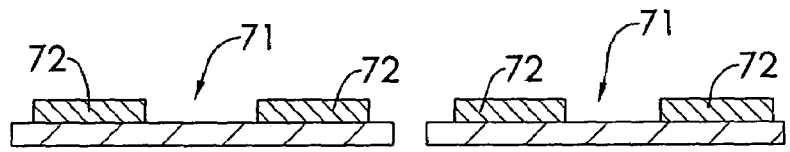
Figure 1C:
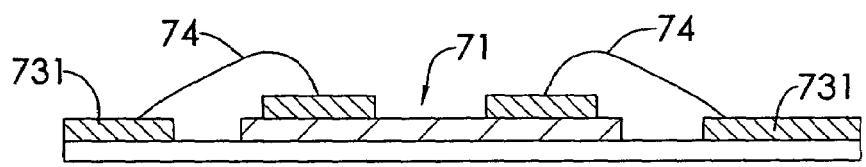
Figure 1D:
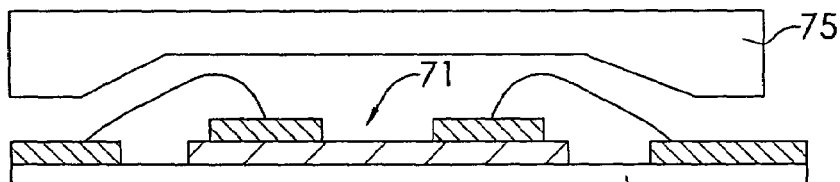
Figure 1E:
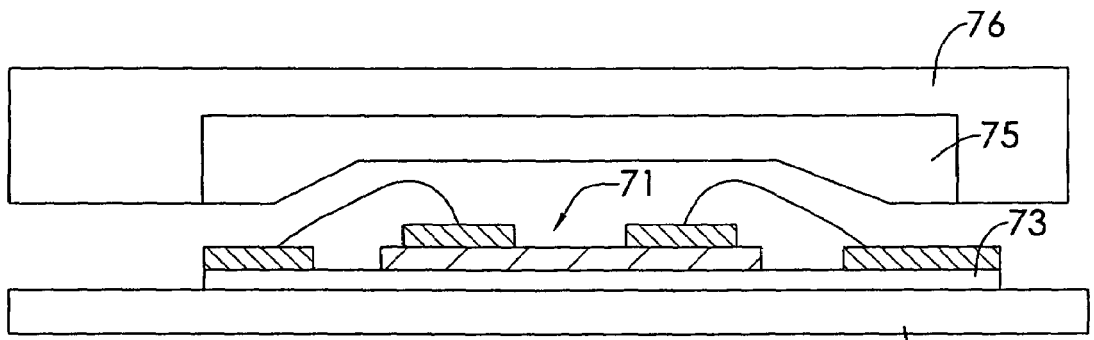
Figure 2A:
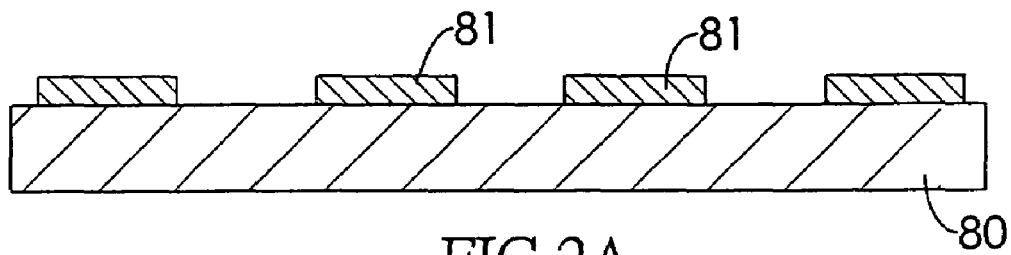
FIGS. 2A-2F show sequential partial product diagrams of another conventional wafer-level package method.
Figure 2B:
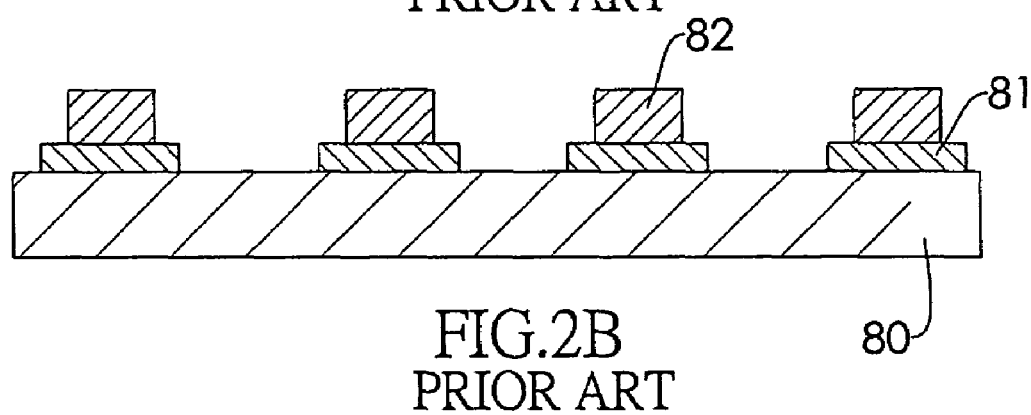
Figure 2C:
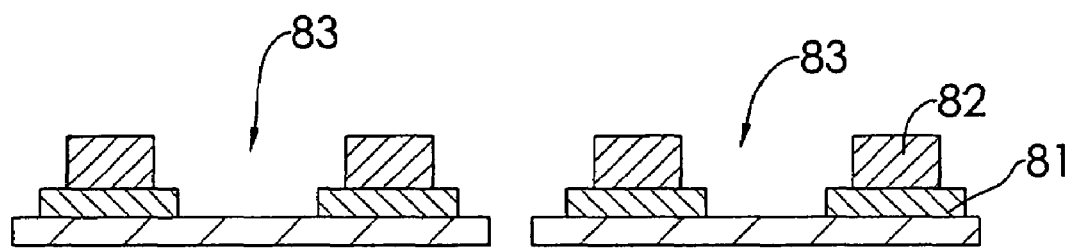
Figure 2D:
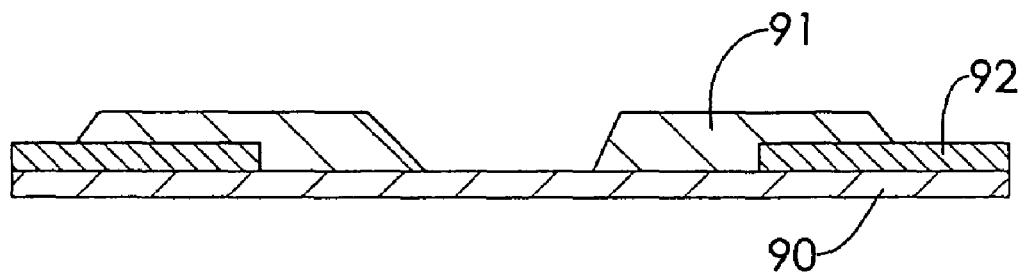
Figure 2E:
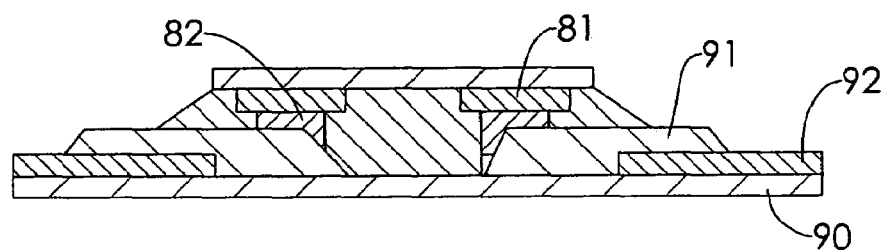
Figure 2F:
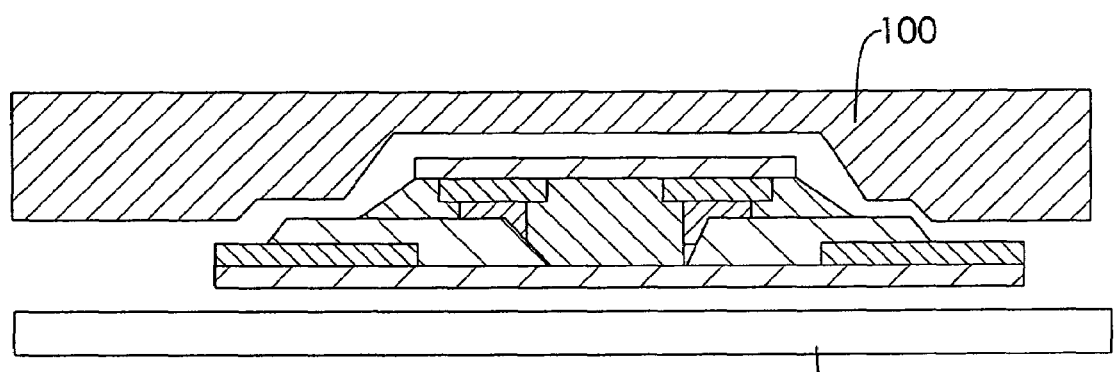
Figure 3A:
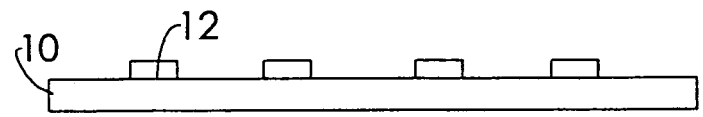
FIGS. 3A-3I show sequential partial product diagrams of a preferred embodiment of an IC module assembly method for a wafer-level package in accordance with the present invention.
Figure 3B:
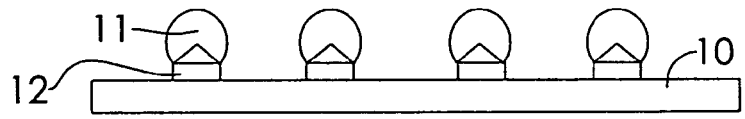

With reference to FIGS. 3A-3B, the metal bumps (11) are formed on a surface of the wafer (10) by printing a conductive metal paste on I/O pads (12) of the wafer (10) with a steel plate printing technique. Then the conductive metal paste is dried and baked to form the metal bump (11). The conductive metal paste may be a cooper, silver or solder paste.

Figure 3C:
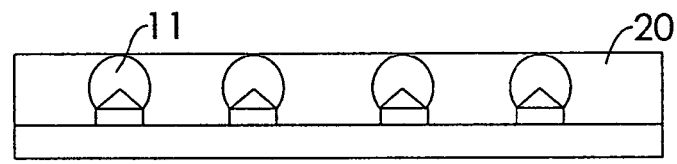

With reference to FIG. 3C, a high polymer resin coating (20) is applied to the surface of the wafer (10) over the metal bump (11) with a printing technique and dried and baked.

Figure 3D:
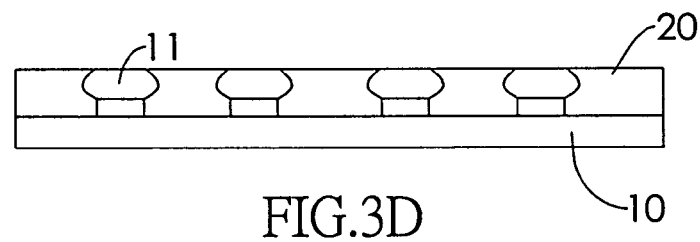

With reference to FIG. 3D, grinding a surface of the resin coating (20): the solidified resin coating (20) on the surface of the wafer (10) is ground until the metal bump (11) is exposed and a required thickness of the resin coating (20) is reached.

Figure 3E:
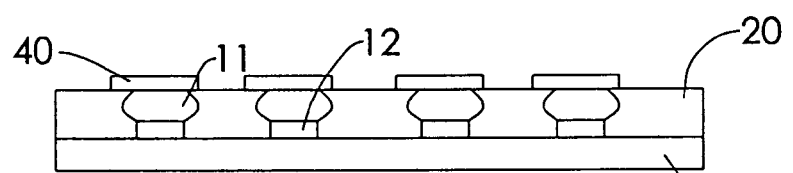

With reference to FIG. 3E, printing an endpoint (40): an endpoint (40) refers to a joint point of a wafer die part and an antenna or a substrate and is normally a silver or solder paste.

Figure 3F:
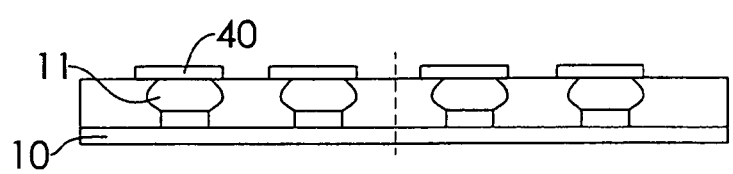
Figure 3G:
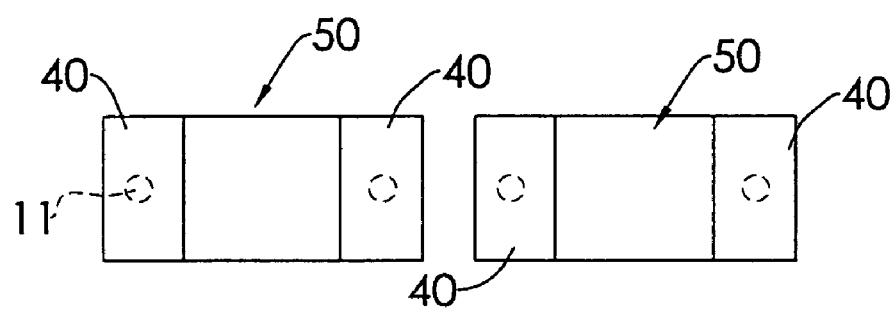

With reference to FIGS. 3F-3G, grinding and cutting a step: grinding a back side of the wafer (10) to a required thickness and then cutting the wafer (10), along the broken lines, into multiple chips (50).

Figure 3H:
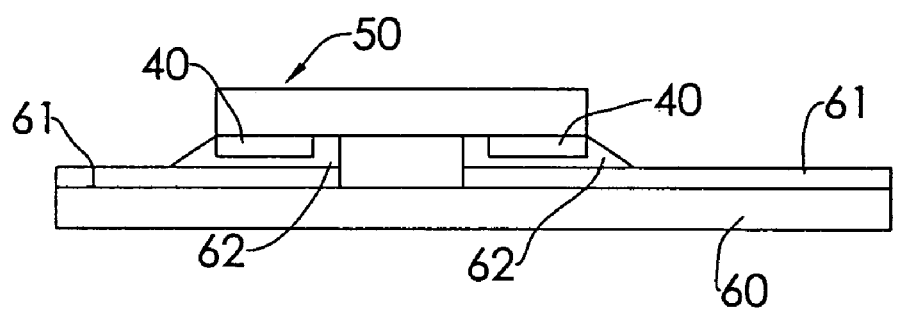

With reference to FIG. 3H, the step comprises bonding the chip (50) to an antenna or substrate (60) with SMT (surface mounting technology). The substrate (60) includes conductive circuits (61) formed on a surface of the substrate (60). The chip (50) can be contacted with the circuits (61) by conductive metal paste (62) such as a cooper, silver or solder paste.

Figure 3I:
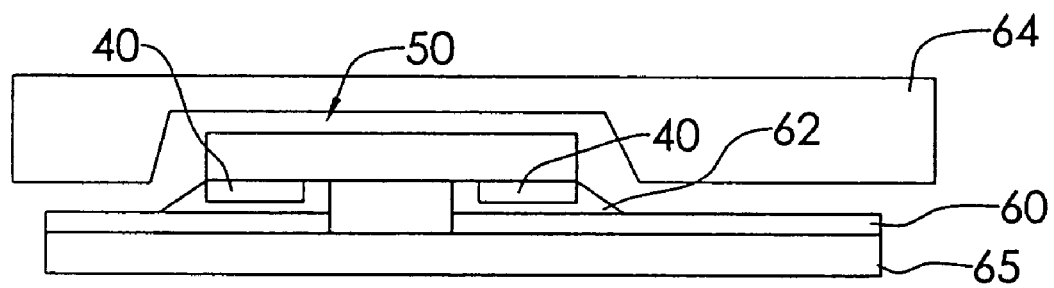

With reference to FIG. 3I, the chip (50) bonded on the substrate (60) is further packaged by lamination films (64) (65).

The wafer-level package and the IC module assembly method for the wafer-level package make use of features of the IC module of a small sized IC with a few pins to apply an inexpensive wafer-level package method, then grind and dice a wafer into an SMD (surface mount device) product. The SMD product can be effectively manufactured and mounted on an antenna or substrate with mass production.

The present invention can be used to manufacture high quality chips of low cost with mass production to significantly reduce cost and maintain high quality of the products.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A wafer-level package and an IC module assembly method for the wafer-level package comprising:
    forming a metal bump on a wafer: printing a conductive metal paste on an I/O pad of the wafer with a steel plate printing technique, then solidifying to form the metal bump;
    applying a high polymer resin coating: applying the high polymer resin coating to the surface of the wafer over the metal bump with a printing technique and solidifying the resin coating;
    grinding a surface of the resin coating: grinding the solidified resin coating on the surface of the wafer until the metal bump is exposed and a required thickness of the resin coating is reached;
    printing an endpoint on the exposed metal bump: an endpoint referring to a joint point of a wafer die part and an antenna or a substrate;
    grinding and cutting: grinding a back side of the wafer to a required thickness, then cutting the wafer into multiple chips to complete a package process; and
    bonding the chips to an antenna or substrate with SMT (surface mounting technology).

2. The wafer-level package and the IC module assembly method for the wafer-level package as claimed in claim 1, wherein the conductive metal paste is a cooper paste.

3. The wafer-level package and the IC module assembly method for the wafer-level package as claimed in claim 1, wherein the conductive metal paste is a silver paste.

4. The wafer-level package and the IC module assembly method for the wafer-level package as claimed in claim 1, wherein the conductive metal paste is a solder paste.

5. The wafer-level package and the IC module assembly method for the wafer-level package as claimed in claim 1, wherein the endpoint is a silver paste.

6. The wafer-level package and the IC module assembly method for the wafer-level package as claimed in claim 1, wherein the endpoint is a solder paste.

* * * * *